United States Patent [19]
Yoeli et al.

[11] Patent Number: 5,861,641
[45] Date of Patent: *Jan. 19, 1999

[54] CUSTOMIZABLE LOGIC ARRAY DEVICE

[75] Inventors: Uzi Yoeli; Eran Rotem; Meir Janai; Zvi Orbach, all of Haifa, Israel

[73] Assignee: Quick Technologies Ltd., Haifa, Israel

[ * ] Notice: The term of this patent shall not extend beyond the expiration date of Pat. No. 5,679,967.

[21] Appl. No.: 290,550

[22] Filed: Aug. 15, 1994

[30] Foreign Application Priority Data

May 1, 1994 [IL] Israel ........................................ 109491

[51] Int. Cl.⁶ ........................ H03K 19/177; H01L 27/02; H01L 27/118
[52] U.S. Cl. .......................... 257/211; 257/529; 257/202; 257/204; 257/208; 257/210
[58] Field of Search ................................... 257/202, 203, 257/208–211, 204, 529

[56] References Cited

U.S. PATENT DOCUMENTS

| 4,197,555 | 4/1980 | Uehara et al. ............................ 257/211 |
| 4,240,094 | 12/1980 | Mader ..................................... 257/209 |
| 4,295,149 | 10/1981 | Balyoz et al. ........................... 257/211 |
| 4,750,026 | 6/1988 | Kuninobu et al. ....................... 257/211 |
| 4,825,105 | 4/1989 | Holzle .................................... 307/440 |
| 4,873,459 | 10/1989 | El Gamal et al. ....................... 326/411 |
| 4,875,971 | 10/1989 | Orbach et al. .......................... 257/750 |
| 4,910,417 | 3/1990 | El Gamal et al. ........................ 326/41 |
| 4,924,287 | 5/1990 | Orbach ................................... 257/209 |
| 4,933,738 | 6/1990 | Orbach et al. .......................... 257/209 |
| 4,949,149 | 8/1990 | Arraut et al. ........................... 257/211 |
| 5,049,969 | 9/1991 | Orbach et al. .......................... 257/211 |
| 5,055,716 | 10/1991 | El Gamel ................................ 257/205 |
| 5,095,356 | 3/1992 | Ando et al. ............................. 257/202 |
| 5,111,273 | 5/1992 | Orbach et al. .......................... 257/208 |
| 5,132,571 | 7/1992 | McCollum et al. ...................... 326/41 |
| 5,172,014 | 12/1992 | El Ayat et al. .......................... 326/41 |
| 5,185,283 | 2/1993 | Fukui et al. ............................. 257/208 |
| 5,198,705 | 3/1993 | Galbraith et al. ........................ 326/37 |
| 5,223,792 | 6/1993 | El-Ayat et al. .......................... 326/44 |
| 5,260,597 | 11/1993 | Orbach et al. .......................... 257/529 |
| 5,289,021 | 2/1994 | El Gamal ................................ 257/210 |
| 5,341,041 | 8/1994 | El Gamal ................................ 257/204 |
| 5,384,472 | 1/1995 | Yin ......................................... 257/202 |
| 5,387,809 | 2/1995 | Yamagish et al. ...................... 257/204 |
| 5,404,033 | 4/1995 | Wong et al. ............................ 257/209 |
| 5,451,887 | 9/1995 | El-Ayal et al. .......................... 326/39 |
| 5,491,353 | 2/1996 | Kean ...................................... 257/208 |

FOREIGN PATENT DOCUMENTS

| 210397 | 2/1987 | European Pat. Off. . |
| 408060 | 1/1991 | European Pat. Off. . |
| 0107648 | 6/1983 | Japan ..................................... 257/208 |
| 2116165 | 4/1990 | Japan . |
| WO9312582 | 6/1993 | WIPO . |

OTHER PUBLICATIONS

Brown, Stephen et al. Field–Programmable Gate Arrays. (Kluwer Academic Publishers: Norwell, Massachusetts, 1992).

Primary Examiner—Tom Thomas
Assistant Examiner—Alexander Oscar Williams
Attorney, Agent, or Firm—Browdy and Neimark

[57] ABSTRACT

A customizable logic array device including an array of identical multiple input, function selectable logic cells comprising a first conductive layer, application configurable interconnection apparatus selectably interconnecting the multiple input, function selectable logic cells, the application configurable interconnection apparatus comprising at least two conductive layers.

17 Claims, 7 Drawing Sheets

CUSTOMIZABLE LOGIC ARRAY DEVICE

FIELD OF THE INVENTION

The present invention relates generally to customizable logic array devices and more particularly to customizable devices including an array of identical multiple input, function selectable logic cells.

BACKGROUND OF THE INVENTION

Various customizable logic array devices are known in the patent literature. Applicant/assignee's U.S. Pat. Nos. 4,924,287; 4,875,971; 4,933,738; 5,049,969; 5,260,597 and 5,111,273 describe apparatus and techniques that have found commercial acceptance. Other relevant prior art is referenced therein.

Various types of field-programmable gate arrays are known in the art. A review of the state of the art in field-programmable gate arrays appears in the *Field-Programmable Gate Arrays*, by Brown et al, Kluwer Academic Publishers, 1992.

The following U.S. Pat. Nos. 4,197,555; 4,240,094; 4,873,459; 4,910,417; 5,132,571; 5,172,014; 5,198,705 and 5,223,792 describe customizable devices including an array of multiple input, function selectable logic cells.

SUMMARY OF THE INVENTION

The present invention seeks to provide a customizable logic array device including an array of identical multiple input, function selectable logic cells which has substantially improved performance as compared with the prior art.

There is thus provided in accordance with a preferred embodiment of the present invention a customizable logic array device including an array of identical multiple input, function selectable logic cells comprising a first conductive layer, application configurable interconnection apparatus selectably interconnecting the multiple input, function selectable logic cells, the application configurable interconnection apparatus comprising at least two conductive layers.

Preferably, the first conductive layer is non configurable.

In accordance with a preferred embodiment of the present invention, the first conductive layer is a metal layer.

Additionally in accordance with a preferred embodiment of the present invention there is provided a customizable logic array device including an array of multiple input, function selectable logic cells comprising a first conductive layer, application configurable interconnection apparatus selectably interconnecting the multiple input, function selectable logic cells, the application configurable interconnection apparatus comprising at least two conductive layers and having removable portions for customization.

Further in accordance with a preferred embodiment of the present invention there is provided a pre-customized, customizable logic array device including an array of multiple input, function selectable logic cells comprising a first conductive layer, application configurable interconnection apparatus selectably interconnecting the multiple input, function selectable logic cells, the application configurable interconnection apparatus comprising at least two conductive layers and having removable portions for customization, the application configurable interconnection apparatus interconnecting the logic cells so as to render the logic array inoperable until at least some of the removable portions are removed.

Preferably, the removable portions are located in overlapping relationship with the logic cells.

Additionally in accordance with a preferred embodiment of the present invention there is provided a pre-customized, customizable logic array device comprising an array of identical multiple input, function selectable logic cells comprising a first conductive layer, application configurable interconnection apparatus selectably interconnecting the multiple input, function selectable logic cells, said application configurable interconnection apparatus comprising at least two conductive layers, said application configurable interconnection apparatus interconnecting said logic cells so as to render the logic array inoperable until at least part of said application configurable interconnection apparatus is modified.

Preferably, in the pre-customized devices, the application configurable interconnection apparatus is operative to short ground and power until at least part of said application configurable interconnection apparatus is modified.

Preferably the interconnection apparatus comprises fixed vias.

In accordance with a preferred embodiment of the present invention, the logic cells comprise a plurality of logic elements, the logic elements comprising transistor gates.

In the apparatus described above, preferably at least one of the logic cells includes a first multiplexer having a first input, a second input, a first select input and a first multiplexer output and a second multiplexer having a first input, a second input, a second select input, and a second multiplexer output, the first multiplexer including a first selector, responsive to the first select input for passing either the first input or the second input of the first multiplexer to the first multiplexer output and the second multiplexer including a second selector, responsive to the first multiplexer output for passing either the first input or the second input of the second multiplexer to second multiplexer output.

Additionally or alternatively, preferably at least one of the logic cells includes a first multiplexer having a first input, a second input, a first select input and a first multiplexer output and a second multiplexer having a first input, a second input, a second select input, and a second multiplexer output, a third multiplexer having a first input, a second input connected to the first multiplexer output, a third select input connected to the second multiplexer output and a third multiplexer output, the first multiplexer including a first selector, responsive to the first select input for passing either the first input or the second input of the first multiplexer to the first multiplexer output, the second multiplexer including a second selector, responsive to the second select input for passing either the first input or the second input of the second multiplexer to the second multiplexer output and the third multiplexer including a third selector, responsive to the second multiplexer output for passing either the first multiplexer input or the first multiplexer output to the third multiplexer output.

In accordance with a preferred embodiment of the present invention there is provided a universal logic cell including a first multiplexer having a first input, a second input, a first select input and a first multiplexer output and a second multiplexer having a first input, a second input, a second select input, and a second multiplexer output, the first multiplexer including a first selector, responsive to the first select input for passing either the first input or the second input of the first multiplexer to the first multiplexer output and the second multiplexer including a second selector, responsive to the first multiplexer output for passing either the first input or the second input of the second multiplexer to second multiplexer output.

Additionally in accordance with a preferred embodiment of the present invention there is provided a universal logic cell including a first multiplexer having a first input, a second input, a first select input and a first multiplexer output and a second multiplexer having a first input, a second input, a second select input, and a second multiplexer output, a third multiplexer having a first input, a second input connected to the first multiplexer output, a third select input connected to the second multiplexer output and a third multiplexer output, the first multiplexer including a first selector, responsive to the first select input for passing either the first input or the second input of the first multiplexer to the first multiplexer output, the second multiplexer including a second selector, responsive to the second select input for passing either the first input or the second input of the second multiplexer to the second multiplexer output and the third multiplexer including a third selector, responsive to the second multiplexer output for passing either the first multiplexer input or the first multiplexer output to the third multiplexer output.

In accordance with a preferred embodiment of the present invention there is provided a customizable logic array whose density is greater by an order of magnitude than that of prior art programmable logic devices produced for similar design rules. Notwithstanding its complexity, the logic array of the present invention is capable of being customized for a specific application within a few hours, utilizing standard photolithography or laser beam micromachining techniques.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
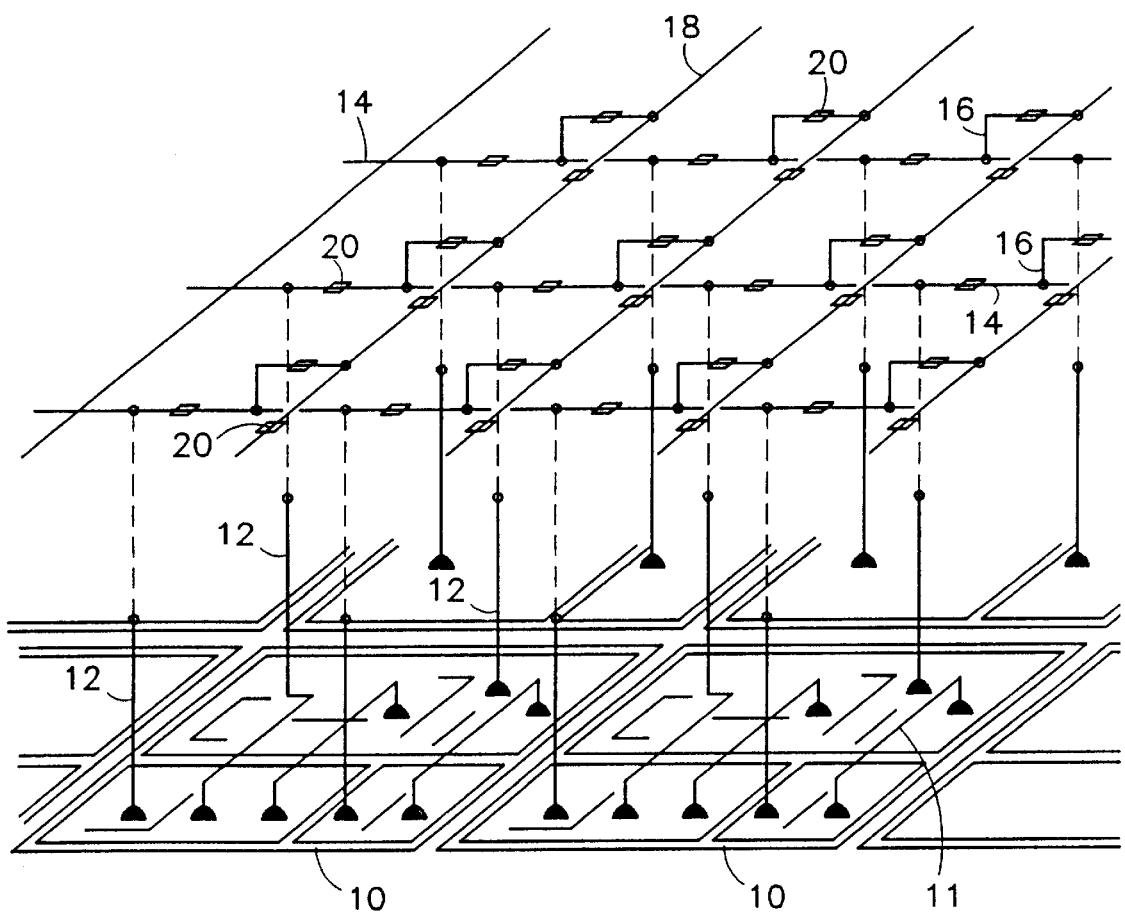
FIG. 1 is a simplified illustration of part of a customizable logic array device constructed and operative in accordance with a preferred embodiment of the present invention.

Reference is now made to FIG. 1, which is a simplified illustration of part of a customizable logic array device constructed and operative in accordance with a preferred embodiment of the present invention.

As seen in FIG. 1, a multiplicity of unit logic cells 10 are defined by a metal I layer 11 on a silicon substrate. The unit logic cells are characterized in that they constitute multiple input, function selectable logic cells and are preferably, although not necessarily, all identical. Any suitable type of multiple input, function selectable logic cell may be used for this purpose. Various types of such logic cells are described in A Comparison of Universal-Logic-Module Realizations and Their Application in the Synthesis of Combinatorial and Sequential Logic Networks by X. Chen et al IEEE Transactions on Computers Vol C-31, No. 2, February 1982 pp. 140 ff as well as in the prior art documents mentioned hereinabove in the Background of the Invention. The disclosures of all of these documents are hereby incorporated herein by reference.

Coupled to various junctions in cells 10 by vias 12 is a Metal II layer 14, which in turn is connected by vias 16 to a Metal III layer 18. The metal II and metal III layers together constitute application configurable interconnection apparatus selectably interconnecting the multiple input, function selectable logic cells 10.

In accordance with a preferred embodiment of the invention the metal II and metal III layers 14 and 18 include a multiplicity of radiation selectable fuses 20. The term "fuse" is used throughout to refer to an electrically conductive link which is selectably breakable by local impingement of radiation having predetermined characteristics. Preferably the fuses 20 are breakable by laser radiation.

Techniques for laser breakage of fuses are described inter alia in applicant/assignee's U.S. Pat. Nos. 4,924,287 and 5,111,273, the disclosures of which are hereby incorporated by reference.

Further in accordance with a preferred embodiment of the invention, the fuses 20 of layers 14 and 18 may be removed by a masking and etching technique wherein the fuses are coated by a radiation sensitive resist. Preferably the actinic radiation may be visible blue light. Alternatively, the following types of radiation inputs may be employed: UV, X-ray, electron beam and ion beam.

In the above-described technique, the fuses are coated by a radiation sensitive resist layer and the resist layer is locally exposed in a selective manner to select those fuses to be removed. After resist development, the exposed fuses are removed by chemical or reactive ion etching.

Techniques for breakage of fuses at both metal II and metal III layers with a single masking step are described in applicant/assignee's U.S. Pat. No. 4,875,971 and in U.S. patent application Ser. No. 07/626,199, the disclosures of which are hereby incorporated by reference.

Figure 2:
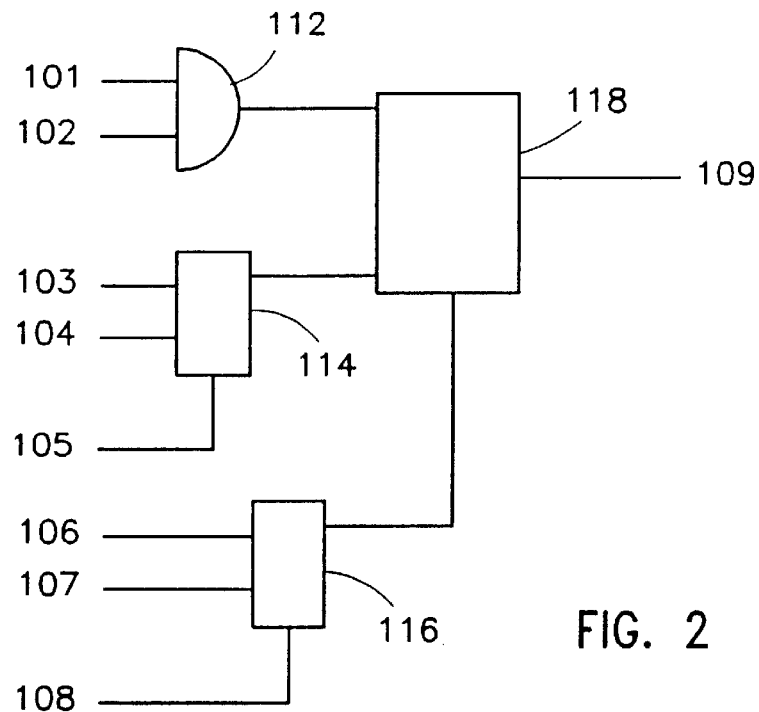
FIG. 2 is a schematic illustration of a preferred logic cell for use in the customizable logic array device of FIG. 1.

Reference is now made to FIG. 2, which schematically illustrates a preferred logic cell for use in the customizable logic array device of FIG. 1. The cell of FIG. 2 comprises four cells, an AND gate 112, first and second selectors 114 and 116 and a third selector 118. The AND gate and the first and second selector receive inputs 101, 102, 103, 104, 105, 106, 107 and 108 and are connected to the third selector 118 as shown. The third selector has an output port 109.

Numerous functions can be performed by the logic cell of FIG. 2, depending on the selection of the various inputs. Table 1 describes eight such functions:

TABLE 1

| | INPUT SELECTION | | | | | | | FUNCTION DESCRIPTION |
|---|---|---|---|---|---|---|---|---|
| | 101 | 102 | 103 | 104 | 105 | 106 | 107 | 108 AT OUTPUT PORT 109 |
| 1. | A | B | 0 | 0 | 0 | 0 | 0 | 0 $A \cdot B$ |
| 2. | A | B | 0 | 0 | 0 | 1 | 0 | C $A \cdot B \cdot C$ |
| 3. | A | B | 0 | 0 | 0 | 0 | 1 | C $A \cdot B \cdot \bar{C}$ |
| 4. | A | 1 | 1 | 0 | 0 | B | 1 | C $A + B + C$ |
| 5. | A | B | A | 1 | B | C | 0 | 0 $A \cdot B + A \cdot C + B \cdot C$ |
| 6. | CLN | 1 | Z | D | E | 0 | CLN | PRN LATCH WITH CLEAR & PRESET |
| 7. | 0 | 0 | 0 | A | B | 0 | C | D $A \cdot B \cdot C \cdot D$ |
| 8. | B | C | C | 0 | B | 1 | 0 | A $(A \oplus B) \cdot C$ |

Figure 3A:
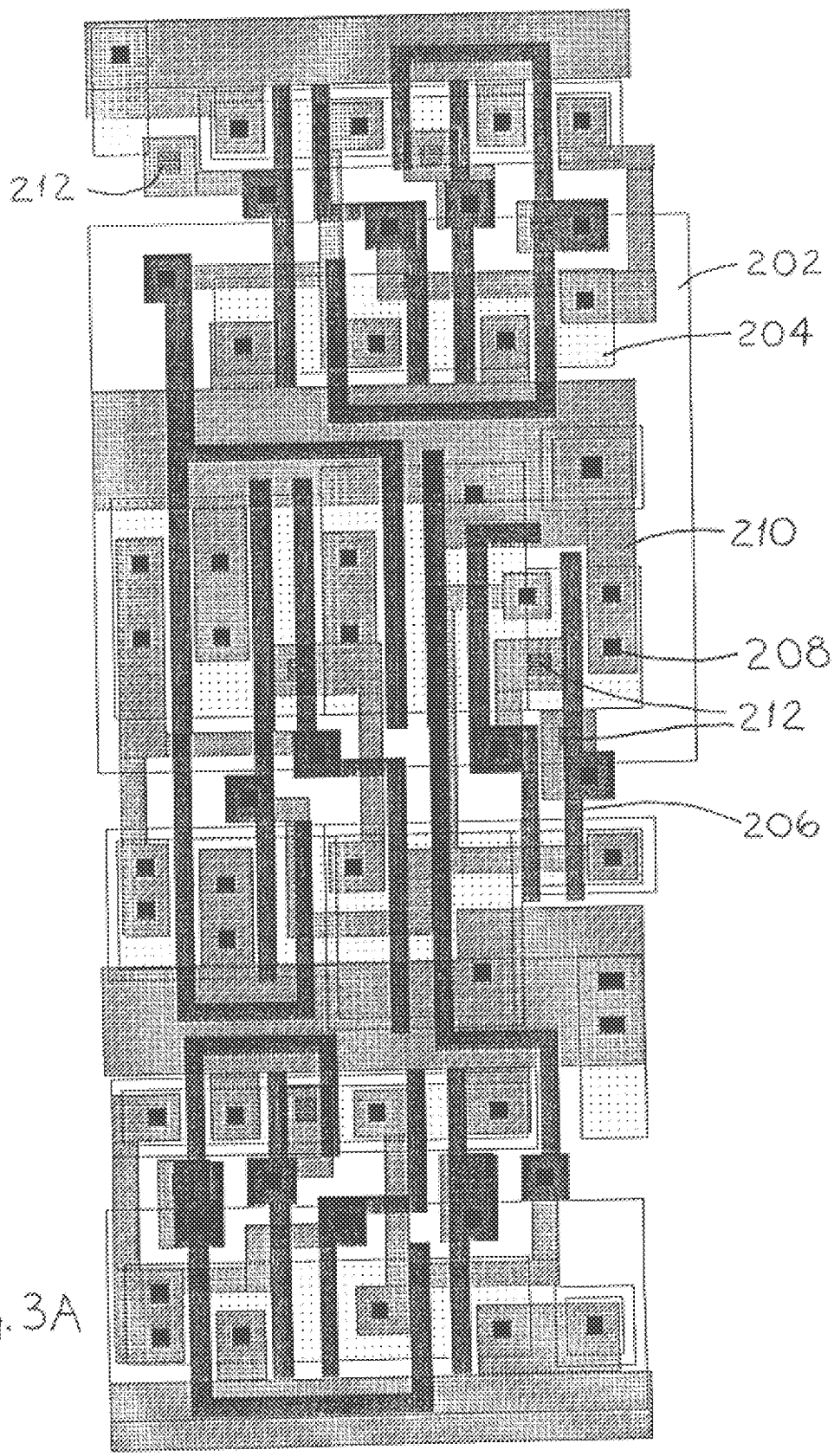
FIGS. 3A and 3B are two examples of preferred function selectable logic cells for use in the customizable logic array device of FIG. 1.
Figure 3B:
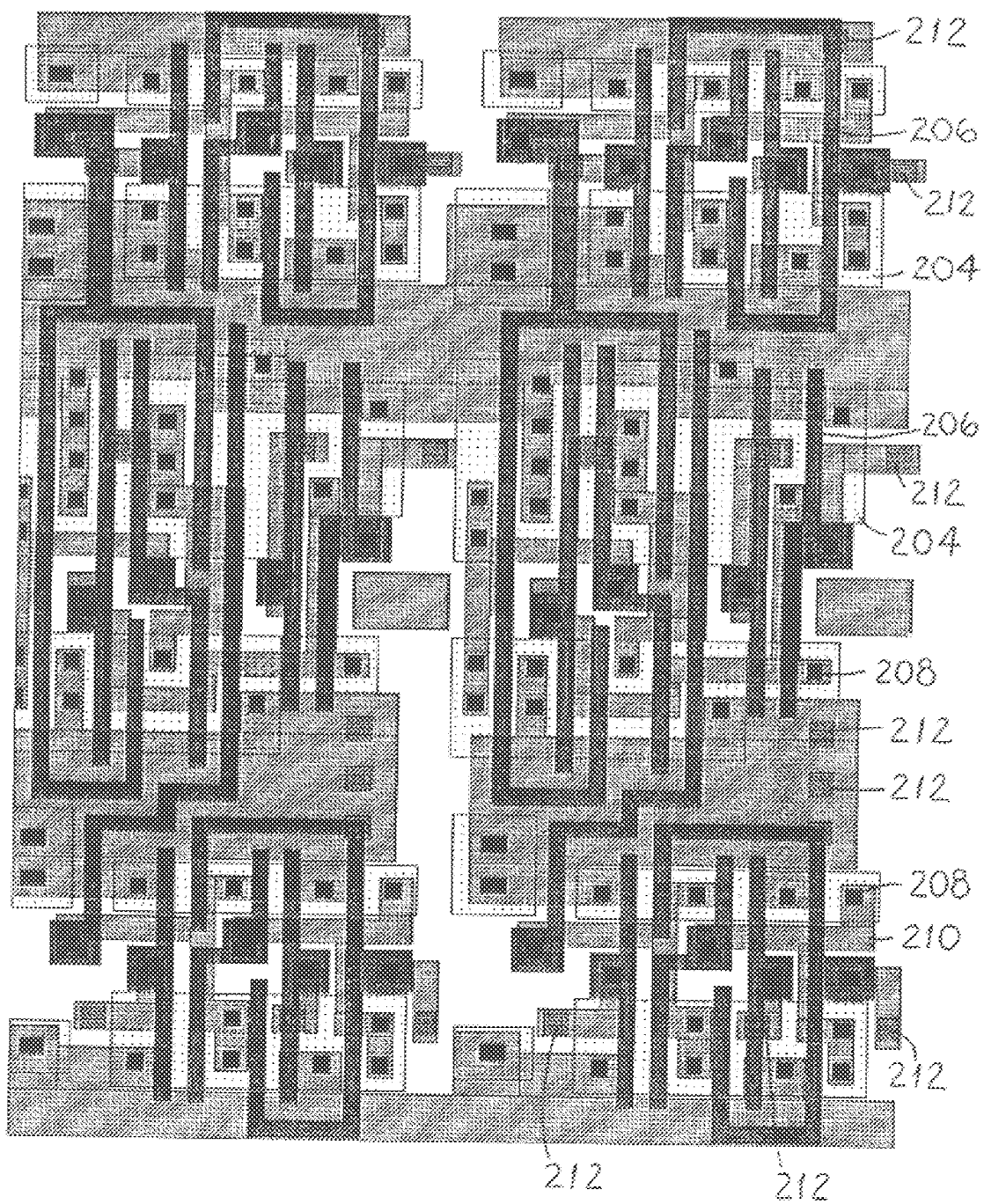

Reference is now made to FIGS. 3A and 3B which are two examples of preferred architectures of logic cells useful in the customizable logic array device of FIG. 1. The logic cells are implemented in a CMOS structure with a layer 202 being the well, a layer 204 being the implant, a layer 206 being the poly gate layer, a layer 208 providing the contacts; a layer 210 being metal I and a layer 212 defining a plurality of vias which connect the metal I layer to the upper interconnect layers.

Preferably neither the poly gate layer 206 nor the metal I layer 210 are customizable and the function of the logic cell is solely determined by selecting the inputs to the various vias defined by layer 212. Preferably, the poly gates have different sizes, optimized for their particular roles in the logic cells.

Figure 4A:
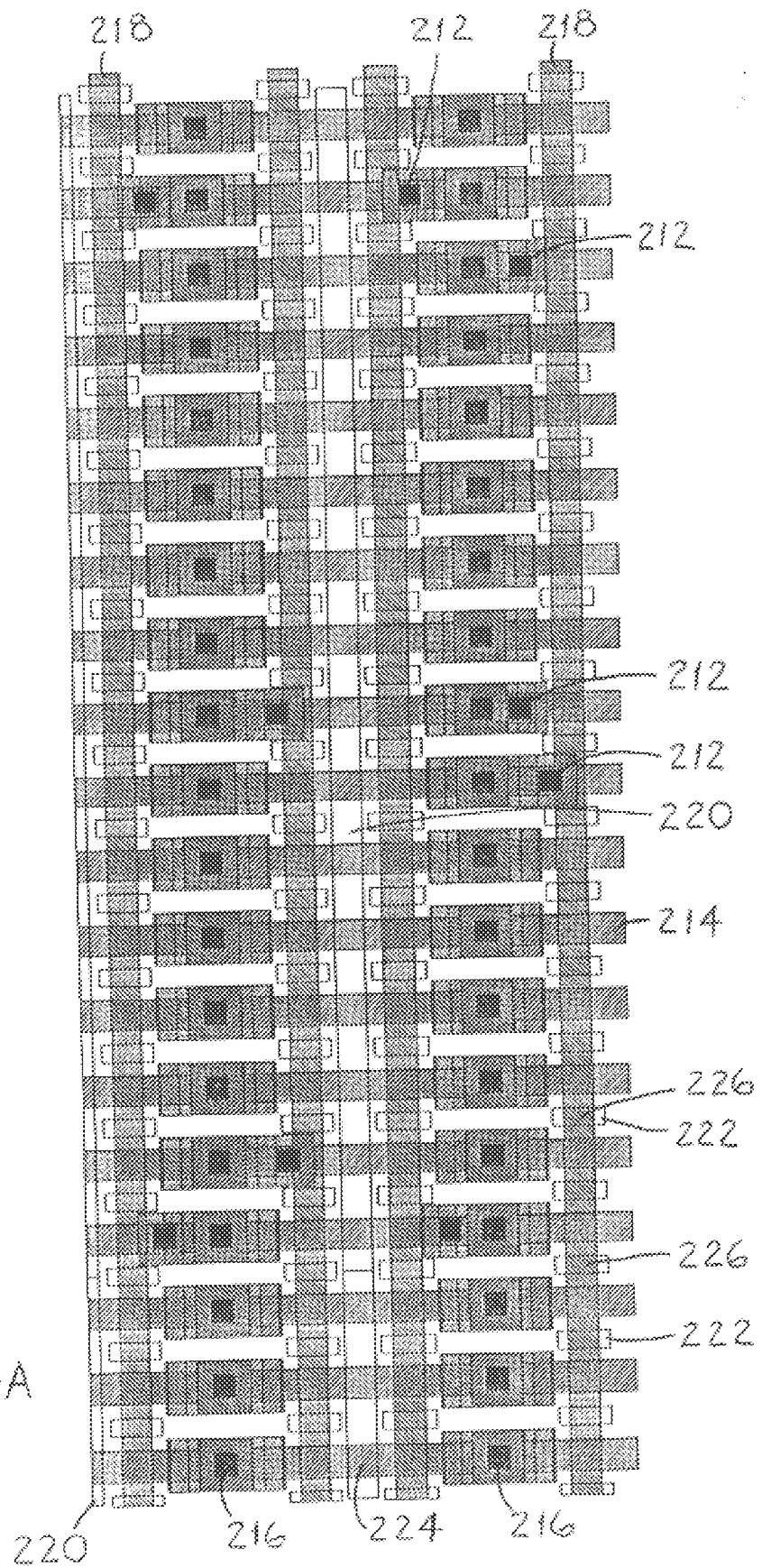
FIGS. 4A and 4B are two examples of preferred routing architectures useful in the customizable logic array device of FIG. 1 for use with the respective cells illustrated in FIGS. 3A and 3B.
Figure 4B:
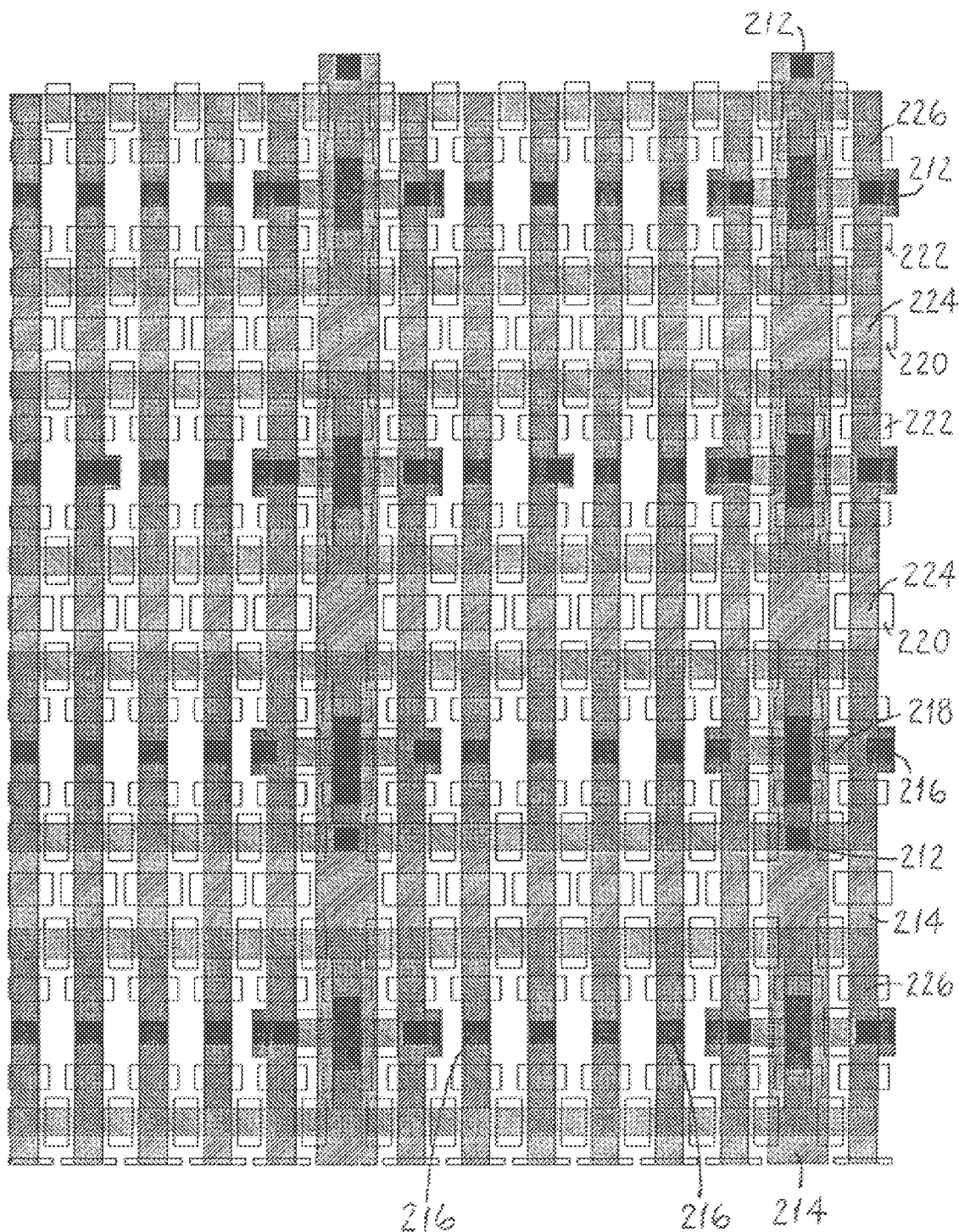

Reference is now made to FIGS. 4A and 4B which are two examples of preferred routing architectures corresponding to the logic cells shown in FIGS. 3A and 3B respectively.

The routing structure comprises two metal interconnect layers, namely metal II indicated by reference numeral 214 and metal III indicated by reference numeral 218. The metal II and metal III layers are generally arranged as mutually perpendicular arrays of strips which extend in mutually parallel planes. The metal II and metal III layers are connected to each other at selected locations by vias 216 and are connected to the logic cells therebelow by means of vias 212.

Rectangles 220 and 222 which are shown covering the fuses 224 and 226 of the metal II and metal III layers respectively indicate the areas to which radiation should be directed in order to break the fuses during customization of the array.

Figure 5B:
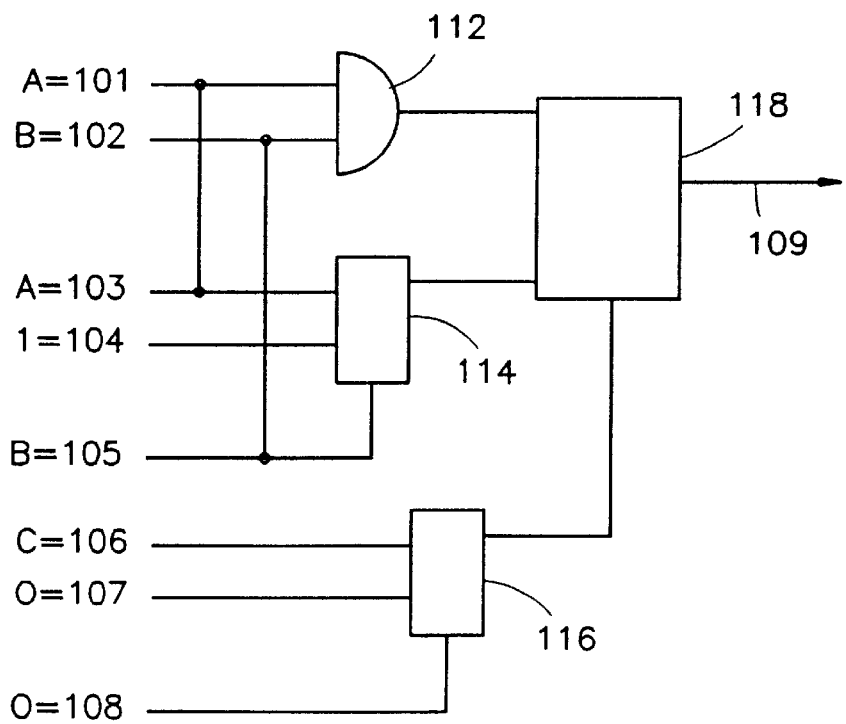
FIG. 5B is a schematic illustration of the resultant electronic functionality of the embodiment of FIG. 5.
Figure 5:
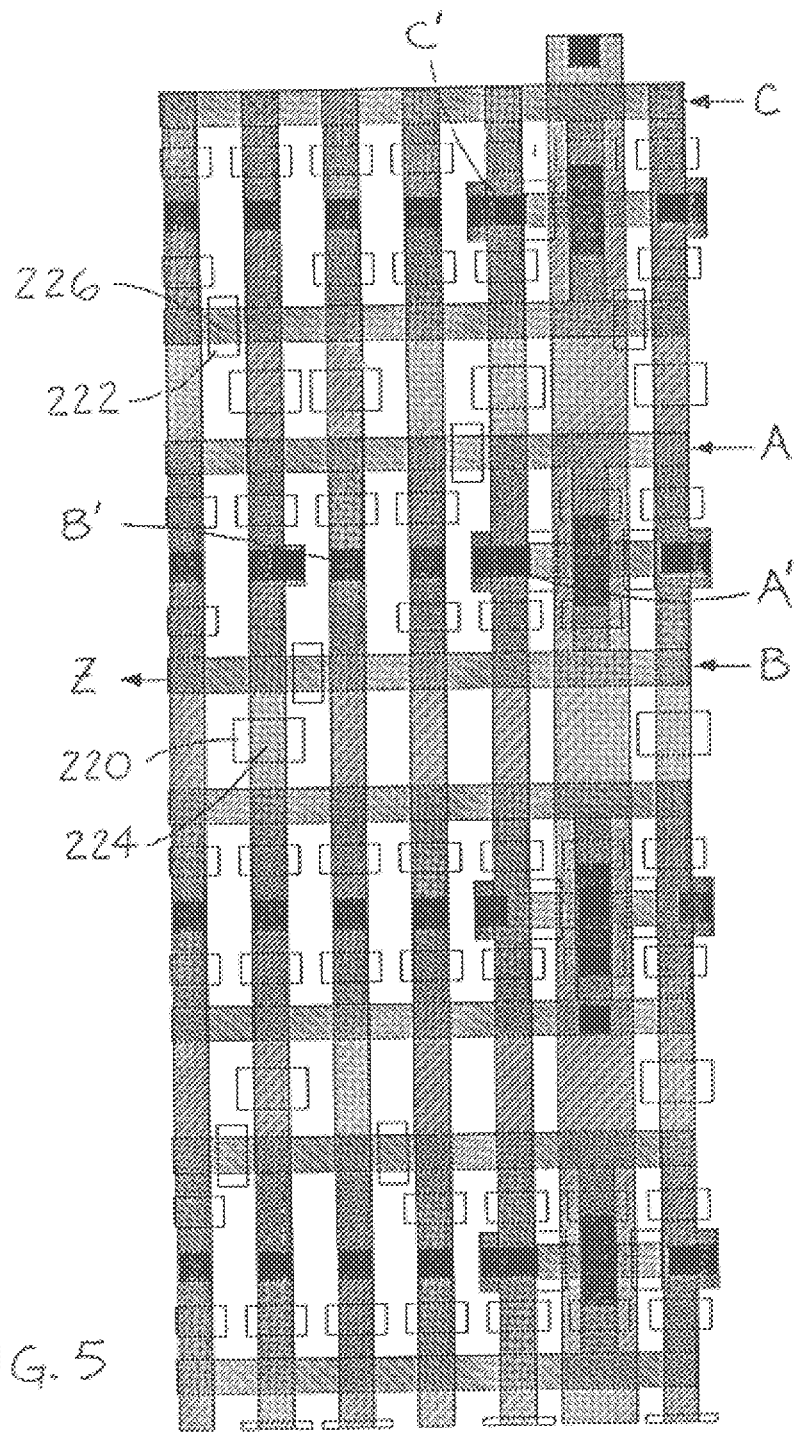
FIG. 5 is an illustration of the routing architecture shown in FIG. 4B wherein a selection of fuses is made.

Reference is now made to FIGS. 5 and 5B. FIG. 5 shows a specific case of the breakage of fuses which implements example No. 5 of Table 1 in the logic cell of FIG. 3B. The fuses 224 and 226 which are cut are marked by rectangles while all other fuses are unmarked. The inputs A, B and C are supplied through the metal II layer as shown and they are connected to the logic cell through vias indicated as A', B' and C'.

FIG. 5B is a schematic illustration of the embodiment of FIG. 2, performing the selected function No. 5 of Table 1, by virtue of being personalized as indicated in FIG. 5. Preferably the device which comprises the function selectable logic cells and the customizable routing structure contains other electronic cells such as I/O cells, drivers and memory modules which are connected to the cells modules by the routing structure.

It will be appreciated by persons skilled in the art that the present invention is not limited by what has been particularly shown and described hereinabove. Rather the scope of the present invention is defined only by the claims which follow:

We claim:

1. A customizable logic array device comprising:
   an array of identical multiple input function selectable logic cells, the function of each logic cell being determined by its inputs, the array comprising a first conductive layer;
   application configurable interconnection apparatus selectably interconnecting the multiple input function selectable logic cells, said application configurable interconnection apparatus comprising at least two conductive layers pre-connected to each other at a multiplicity of via connection points.

2. A customizable logic array device according to claim 1 and wherein said first conductive layer is non configurable.

3. A customizable logic array device according to claim 1 and wherein said first conductive layer is a metal layer.

4. A customizable logic array device according to claim 2 and wherein said first conductive layer is a metal layer.

5. A customizable logic array device comprising:
   an array of identical multiple input function selectable logic cells, the function of each logic cell being determined by its inputs, the array comprising a first conductive layer;
   application configurable interconnection apparatus selectably interconnecting the multiple input function selectable logic cells, said application configurable interconnection apparatus comprising at least two conductive layers pre-connected to each other at a multiplicity of via connection points, and having removable portions for customization.

6. A pre-customized, customizable logic array device comprising:
   an array of identical multiple input function selectable logic cells, the function of each logic cell being determined by its inputs, the array comprising a first conductive layer;
   application configurable interconnection apparatus selectably interconnecting the multiple input function selectable logic cells, said application configurable interconnection apparatus comprising at least two conductive layers pre-connected to each other at a multiplicity of via connection points, and having removable portions for customization, said application configurable interconnection apparatus interconnecting said logic cells so as to render the logic array inoperable until at least some of the removable portions are removed.

7. Apparatus according to claim 5 and wherein said removable portions are located in overlapping relationship with said logic cells.

8. Apparatus according to claim 6 and wherein said removable portions are located in overlapping relationship with said logic cells.

9. A pre-customized, customizable logic array device comprising:

an array of identical multiple input function selectable logic cells, the function of each logic cell being determined by its inputs, the array comprising a first conductive layer;

application configurable interconnection apparatus selectably interconnecting the multiple input function selectable logic cells, said application configurable interconnection apparatus comprising at least two conductive layers pre-connected to each other at a multiplicity of via connection points, said application configurable interconnection apparatus interconnecting said logic cells so as to render the logic array inoperable until at least part of said application configurable interconnection apparatus is modified.

10. Apparatus according to claim 5 and wherein the application configurable interconnection apparatus is operative to short ground and power until at least part of said application configurable interconnection apparatus is modified.

11. Apparatus according to claim 6 and wherein the application configurable interconnection apparatus is operative to short ground and power until at least part of said application configurable interconnection apparatus is modified.

12. Apparatus according to claim 5 and wherein said removable portions are removable by laser radiation.

13. Apparatus according to claim 5 and wherein said removable portions are removable by patterned irradiation of a radiation sensitive resist covering them, followed by lithography and etching.

14. Apparatus according to claim 5 and wherein said interconnection apparatus comprises fixed vias.

15. A customizable logic array device according to claim 1 and wherein said logic cells comprise a plurality of logic elements, said logic elements comprising transistor gates.

16. Apparatus according to claim 1 and wherein at least one of said logic cells includes:

a first multiplexer having a first input, a second input, a first select input and a first multiplexer output; and a second multiplexer having a first input, a second input, a second select input, and a second multiplexer output, said first multiplexer including a first selector, responsive to said first select input for passing either said first input or said second input of said first multiplexer to said first multiplexer output; and said second multiplexer including a second selector, responsive to said first multiplexer output for passing either said first input or said second input of said second multiplexer to second multiplexer output.

17. Apparatus according to claim 1 and wherein at least one of said logic cells includes:

a first multiplexer having a first input, a second input, a first select input and a first multiplexer output; and a second multiplexer having a first input, a second input, a second select input, and a second multiplexer output, a third multiplexer having a first input, a second input connected to said first multiplexer output, a third select input connected to said second multiplexer output and a third multiplexer output, said first multiplexer including a first selector, responsive to said first select input for passing either said first input or said second input of said first multiplexer to said first multiplexer output;

said second multiplexer including a second selector, responsive to said second select input for passing either said first input or said second input of said second multiplexer to said second multiplexer output; and said third multiplexer including a third selector, responsive to said second multiplexer output for passing either said first input or said first multiplexer output to said third multiplexer output.

\* \* \* \* \*